US012666675B2

(12) United States Patent
Clevenger et al.

(10) Patent No.: US 12,666,675 B2
(45) Date of Patent: Jun. 23, 2026

(54) BURIED NEAR-GATE LOCAL INTERCONNECTS AND METHODS OF THEIR MANUFACTURE

(71) Applicant: International Business Machines Corporation, Armonk, NY (US)

(72) Inventors: Lawrence A. Clevenger, Saratoga Springs, NY (US); Nicholas Anthony Lanzillo, Wynantskill, NY (US); Benjamin D. Briggs, Waterford, NY (US); Kisik Choi, Watervliet, NY (US); Brent A. Anderson, Jericho, VT (US)

(73) Assignee: International Business Machines Corporation, Armonk, NY (US)

( * ) Notice: Subject to any disclaimer, the term of this patent is extended or adjusted under 35 U.S.C. 154(b) by 917 days.

(21) Appl. No.: 17/570,675

(22) Filed: Jan. 7, 2022

(65) Prior Publication Data

US 2023/0223447 A1 Jul. 13, 2023

(51) Int. Cl.
H10D 64/01 (2025.01)
H10D 64/23 (2025.01)

(52) U.S. Cl.
CPC ........... H10D 64/01 (2025.01); H10D 64/251 (2025.01)

(58) Field of Classification Search
CPC .. H10D 64/01; H10D 64/251; H10D 84/0149; H10D 84/038; H10D 84/83;
(Continued)

(56) References Cited

U.S. PATENT DOCUMENTS 5,516,726 A 5/1996 Kim et al.
6,426,558 B1 7/2002 Chapple-Sokol et al.
(Continued)

OTHER PUBLICATIONS

Stamper A.K. et al., "Sub-0.25-Micron Interconnection Scaling: Damascene Copper Versus Subtractive Aluminum", IEEE/SEMI 1998 IEEE/SEMI Advanced Semiconductor Manufacturing Conference and Workshop (Cat. No. 98CH36168), pp. 337-346, doi: 10.1109/ASMC.1998.731585 (1998).
(Continued)

*Primary Examiner* — John P. Dulka
(74) *Attorney, Agent, or Firm* — Scully, Scott, Murphy & Presser, P.C.; L. Jeffrey Kelly, Esq.

(57) ABSTRACT

Methods for fabricating a semiconductor device are provided. The method can include forming a conductive material layer on a semiconductor device, the semiconductor device including at least two gate structures and at least two source/drain surfaces of at least two source/drain regions, wherein an interlevel dielectric layer separates each of the at least two gate structures from each of the at least two source/drain surfaces, wherein the conductive material layer extends through openings of the interlevel dielectric layer, contacting the at least two source/drain surfaces and forming at least two conductive material interconnects, and wherein the conductive material layer extends over the interlevel dielectric layer, forming an interconnect mask over portions of the conductive material layer, wherein the conductive material layer includes an up-via and forming an interconnect by subtractively etching a portion of the conductive material layer, exposed through the interconnect mask.

11 Claims, 10 Drawing Sheets

(58) Field of Classification Search
CPC ......... H01L 21/76885; H01L 21/76895; H01L 21/76897; H01L 21/76816; H01L 21/76877; H10W 20/063; H10W 20/0633; H10W 20/069; H10W 20/0693; H10W 20/0698
See application file for complete search history.

(56)                     References Cited

U.S. PATENT DOCUMENTS

| | | | |
|---|---|---|---|
| 6,534,807 B2 | 3/2003 | Mandelman et al. | |
| 6,680,514 B1 | 1/2004 | Geffken et al. | |
| 6,884,712 B2 | 4/2005 | Yelehanka et al. | |
| 7,364,997 B2 | 4/2008 | Juengling et al. | |
| 8,617,982 B2 | 12/2013 | Danek et al. | |
| 9,653,347 B1 * | 5/2017 | Leobandung | ....... H01L 21/0217 |
| 2007/0218622 A1 | 9/2007 | Lee et al. | |

OTHER PUBLICATIONS

Wan D. et al., "Subtractive Etch of Ruthenium for Sub-5nm Interconnect", 2018 IEEE International Interconnect Technology Conference (IITC), pp. 10-12, doi: 10.1109/IITC.2018.8454841 (2018).

* cited by examiner

100

105    104    105    104    105

W    W 102    102    102    102    102

108    108

106    106    106    106

100

108    108    108    108

106    106    106    106    106

102    105    102    105    102

104    104

100
112
V          V
110
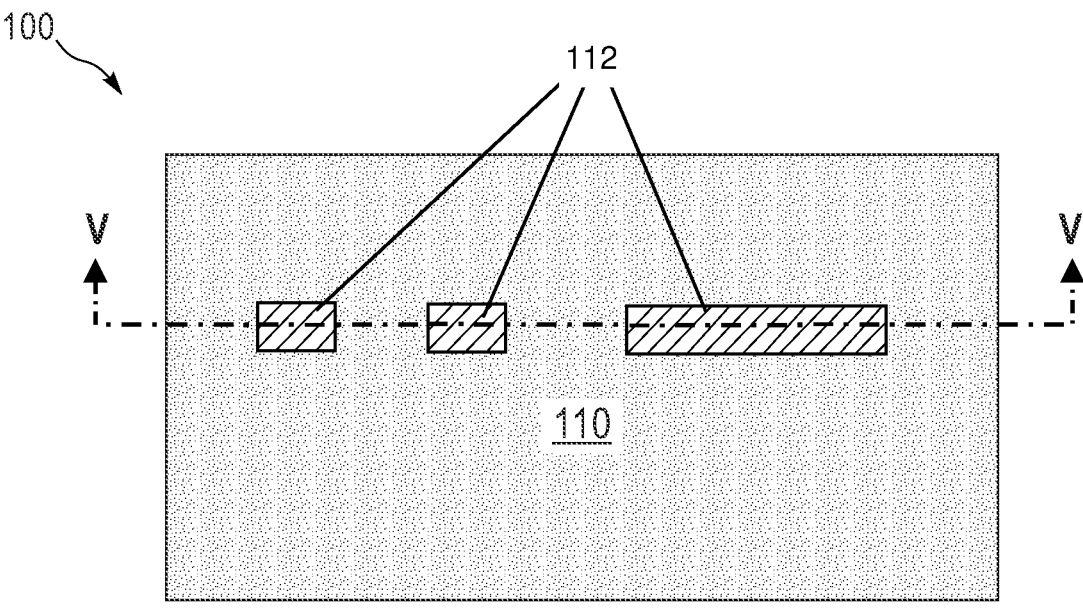
FIG. 3
100
112
110
106          106          106          106          106
102          105          102          105          102
109''''          109'
102          102
104          104
109'''          109''
FIG. 4
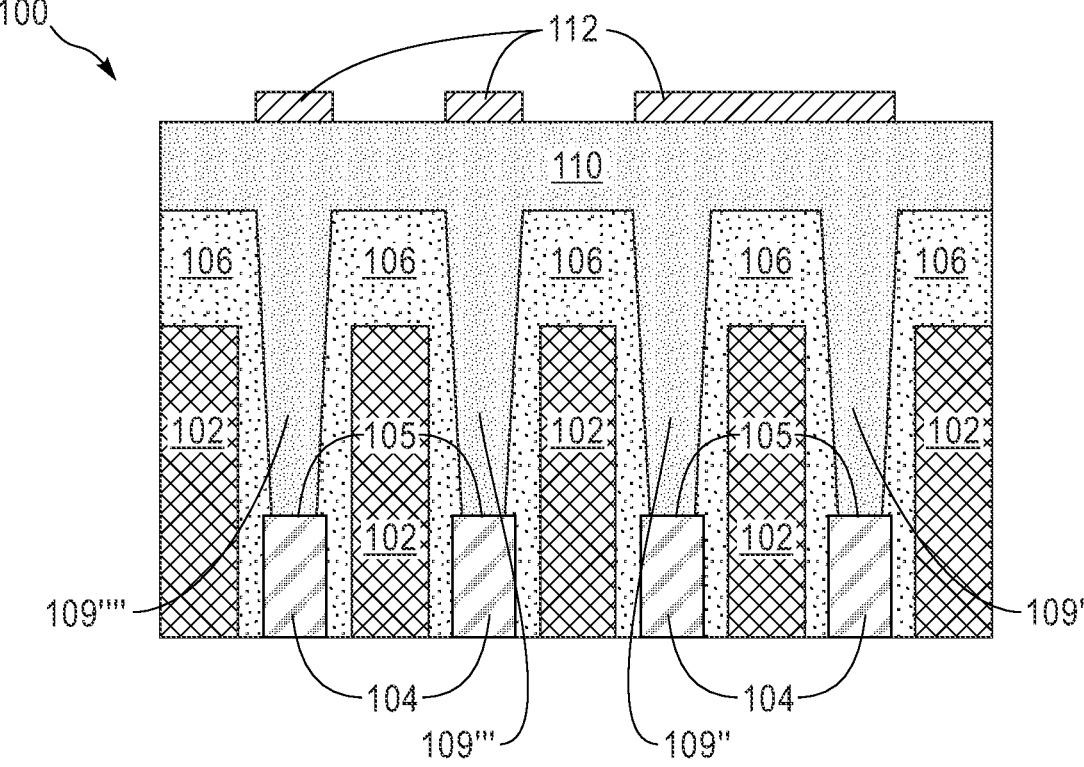

100

100

200

212

S

210

200

212     209'''     212     209''     209'

210

206     206     206     206

202     205     202     205     202     202

204     204

200

212

210

200

212

210

206

202    205    202    205    202

202    202

204    204

BURIED NEAR-GATE LOCAL INTERCONNECTS AND METHODS OF THEIR MANUFACTURE

BACKGROUND

In general, vias are vertical metal interconnect pathways to electrically connect a first metal layer to a second metal layer in a semiconductor device. Very-Large Scale Integrated (VLSI) or Ultra-Large Scale Integrated (ULSI) circuits include interconnect structures where vias connect metal layers in different levels. Vias and metal layers (also referred to as wires) can be formed in a dual damascene process, where via openings and trenches are formed in a dielectric layer followed by deposition of the conductive metal materials to form the vias and metal layers.

Generally, interconnect devices include a plurality of circuits that form an integrated circuit fabricated on an interconnect substrate. A complex network of signal paths will normally be routed to connect the circuit elements distributed on the surface of the substrate. Efficient routing of these signals across the device requires formation of multilevel or multilayered schemes, such as, for example, single or dual damascene wiring, i.e., interconnect, structures.

Within typical interconnect structures, electrically conductive metal vias run perpendicular to the interconnect substrate and electrically conductive metal lines run parallel to the interconnect substrate. Typically, the electrically conductive metal vias are present beneath the electrically conductive metal lines and both features are embedded within an interconnect dielectric material layer.

SUMMARY

Embodiments of the invention provide devices and methods for forming back-end-of-line (BEOL) interconnect structures.

In one embodiment of the present disclosure, a method for fabricating a semiconductor device is provided. The method can include forming a conductive material layer on a semiconductor device, the semiconductor device comprising at least two gate structures and at least two source/drain surfaces of at least two source/drain regions, wherein an interlevel dielectric layer separates each of the at least two gate structures from each of the at least two source/drain surfaces, wherein the conductive material layer extends through openings of the interlevel dielectric layer, contacting the at least two source/drain surfaces and forming at least two conductive material interconnects, and wherein the conductive material layer extends over the interlevel dielectric layer; forming an interconnect mask over portions of the conductive material layer, wherein the conductive material layer comprises an up-via; and forming an interconnect by subtractively etching a portion of the conductive material layer, exposed through the interconnect mask.

In another embodiment of the present disclosure a semiconductor device is provided. The device can include at least two gate structures and at least two source/drain surfaces of at least two source/drain regions, wherein an interlevel dielectric layer separates each of the at least two gate structures from each of the at least two source/drain surfaces; a conductive material layer over a portion of the interlevel dielectric layer, wherein the conductive material layer contacts the at least two source/drain surfaces; and an interconnect of the conductive material layer, wherein the interconnect of the conductive material layer is thinner in height than a height of the conductive material layer over the source/drain surface extending above the interlevel dielectric layer.

In another embodiment of the present disclosure an integrated circuit is provided. The integrated circuit can include at least two gate structures and at least two source/drain surfaces of at least two source/drain regions, wherein an interlevel dielectric layer separates each of the at least two gate structures from each of the at least two source/drain surfaces; a conductive material layer on the semiconductor device and over a portion of the interlevel dielectric layer, wherein the conductive material layer extends through openings of the interlevel dielectric layer, contacting the at least two source/drain surfaces; and an interconnect of the conductive material layer, wherein the interconnect of the conductive material layer is thinner in height than a height of the conductive material layer over the source/drain surface extending above the interlevel dielectric layer.

BRIEF DESCRIPTION OF THE DRAWINGS

Embodiments of the disclosure are described below with reference to the following accompanying drawings:

FIG. 3 depicts a top view of a semiconductor structure, of an embodiment of the disclosure;

FIG. 4 depicts a cross-section view along section line V-V of the semiconductor structure of FIG. 3, of an embodiment of the disclosure;

DETAILED DESCRIPTION

Figure 1:
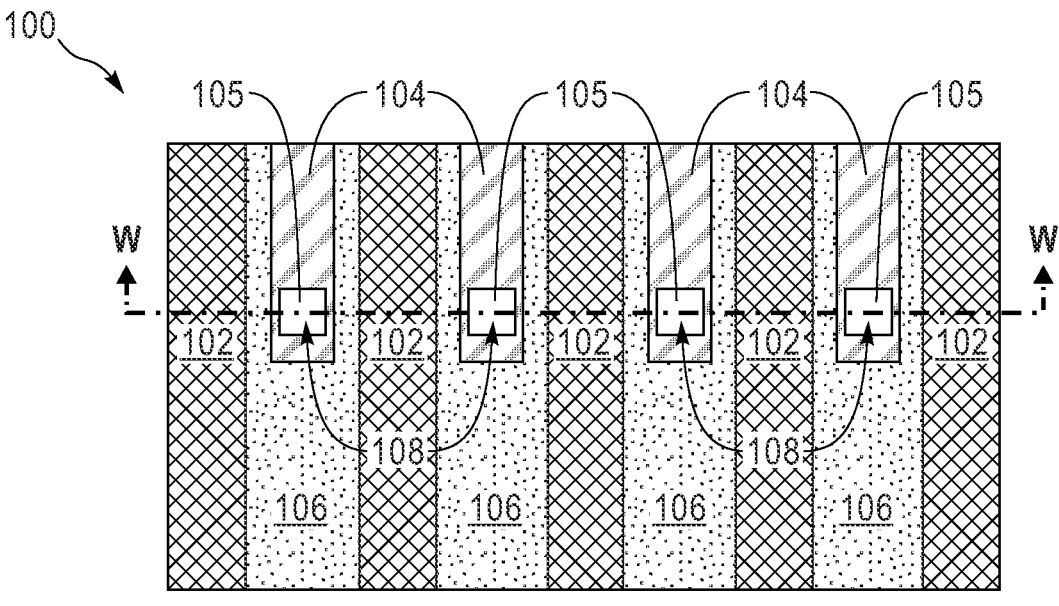
FIG. 1 depicts a top view of a semiconductor structure, of an embodiment of the disclosure.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

As used herein, the term "substantially" is intended to accommodate manufacturing tolerances and indicates that the value listed may be somewhat altered, as long as the alteration does not result in nonconformance of the process or structure to the illustrated embodiment. For example, for some elements the term "substantially" or the term "about" can refer to a comparative variation of ±0.1%, for other elements, the term "substantially" or the term "about" can refer to a comparative variation of ±1% or ±10%, or any point therein.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be accomplished as one step, executed concurrently, substantially concurrently, in a partially or wholly temporally overlapping manner, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher-level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $SiGe_{1-x}$, where x is less than or equal to 1, etc. In addition, other elements can be included in the compound and still function in accordance with the present principles. The compounds with additional elements will be referred to herein as alloys.

Reference throughout the specification to deposition techniques (including thin-film deposition techniques) for depositing silicon nitride, silicon dioxide, metals, or similar materials include such processes as chemical vapor deposition (CVD), low-pressure chemical vapor deposition (LPCVD), metal organic chemical vapor deposition (MOCVD), plasma-enhanced chemical vapor deposition (PECVD), plasma vapor deposition (PVD), atomic layer deposition (ALD), molecular beam epitaxy (MBE), electro-plating, electro-less plating, and the like. Specific embodiments are described herein with reference to examples of such processes. However, the present disclosure and the reference to certain deposition techniques should not be limited to those described. For example, in some circumstances, a description that references CVD may alternatively be done using PVD, or a description that specifies electro-plating may alternatively be accomplished using electro-less plating. Furthermore, reference to techniques of thin film formation may include growing a film in-situ. For example, in some embodiments, controlled growth of an oxide to a desired thickness can be achieved by exposing a silicon surface to oxygen gas or to moisture in a heated chamber.

Reference throughout the specification to photolithography techniques, known in the art of semiconductor fabrication for patterning various thin films, includes a spin-expose-develop process sequence typically followed by an etch process. Alternatively, or additionally, photoresist can also be used to pattern a hard mask (e.g., a silicon nitride hard mask), which, in turn, can be used to pattern an underlying film.

Reference throughout the specification to etching techniques known in the art of semiconductor fabrication for selective removal of polysilicon, silicon nitride, silicon dioxide, metals, photoresist, polyimide, or similar materials includes such processes as wet chemical etching, reactive ion (plasma) etching (RIE), washing, wet cleaning, pre-cleaning, spray cleaning, chemical-mechanical planarization (CMP) and the like. Specific embodiments are described herein with reference to examples of such processes. However, the present disclosure and the reference to certain deposition techniques should not be limited to those described. In some instances, two such techniques may be interchangeable. For example, stripping photoresist may entail immersing a sample in a wet chemical bath or, alternatively, spraying wet chemicals directly onto the sample.

As used herein, an "up-via" metallization scheme refers to an interconnect structure that is formed subtractively from a damascene wire. More specifically, a portion of a conductive metal layer (e.g. damascene wire) is masked so that exposed portions of the conductive metal layer can be recessed (e.g. recessed portion or up-via) to a certain depth by lithography and/or etching processes, leaving a vertically protruding portion (e.g., the remaining masked portion).

In general, in a non-limiting illustrative example, interconnect structures (e.g., up-via metallization schemes) are formed in a subtractive process prior to metallization of a metallization level above the interconnect. An etch stop layer is deposited conformally after the up-via recess and before dielectric deposition for the above metallization level. The etch stop layer prevents over-etching of the dielectric layer when forming trenches in the above metallization level for neighboring metal lines formed to sides of the interconnect.

Figure 2:
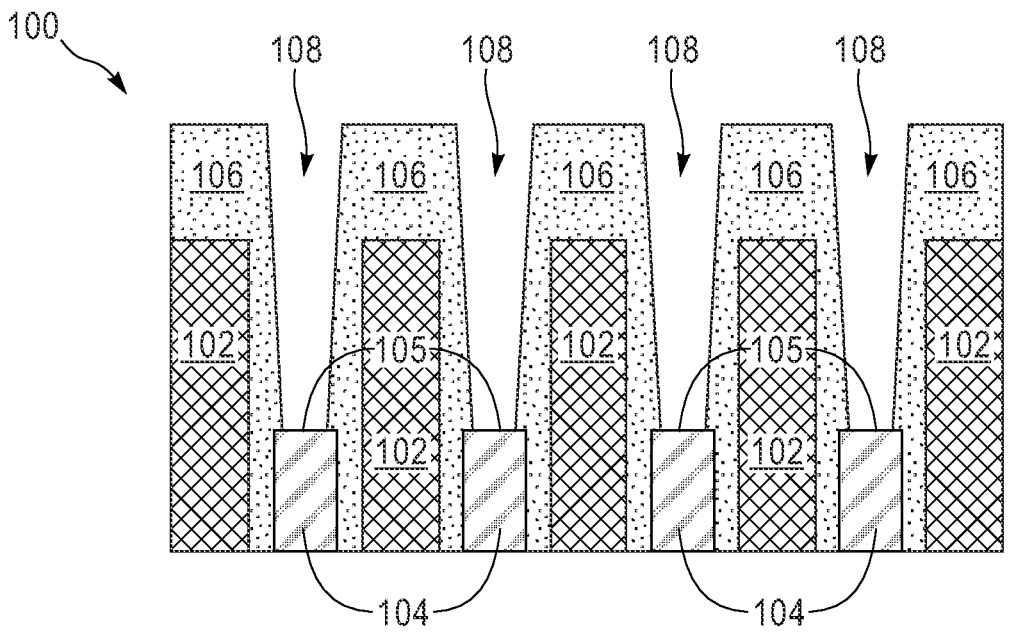
FIG. 2 depicts a cross-section view along section line W-W of the semiconductor structure of FIG. 2, of an embodiment of the disclosure.

Referring to FIGS. 1 and 2, a portion of a semiconductor device 100 (hereinafter "device") is shown. In this embodiment, the device 100 includes at least two gate structures 102 and at least two source/drain surfaces 105 of at least two source/drain regions 104. The source/drain regions 104 are exposed to the exterior of the device 100 through openings 108 of an interlevel dielectric layer 106. The interlevel dielectric layer 106 separates each of the gate structures 102 from each of the source/drain regions 104 and their respective source/drain surfaces 105. It is appreciated by those skilled in the art that the device 100 may include any number of gate structures 102, source/drain regions 104, source/drain surfaces 105 and interlevel dielectric layers 106, despite only four being shown in the figures.

Each of the gate structures 102 can be composed of any suitable gate material, including but not limited to metals, silicides, poly silicons, and combinations thereof.

Each of the source/drain regions 104 can be composed of any suitable dielectric material. The interlevel dielectric layer 106 may be formed of silicon dioxide ($SiO_2$) or another silicon oxide ($SiO_x$), silicon oxynitride (SiON), silicon oxycarbide (SiOC), etc. The interlevel dielectric layer 106 may also comprise an ultra low-k dielectric material (e.g., a material with a dielectric constant less than that of $SiO_2$). The interlevel dielectric layer 106 can be deposited/formed in any suitable way.

A cross-sectional view of the structure of FIG. 1 can be seen in FIG. 2. Line W-W of FIG. 1 illustrates the view of FIG. 2, with FIG. 2 being an intermediary structure of the completed device shown in FIG. 7.

Referring now to FIGS. 3 and 4, the structure 100 is depicted after depositing a conductive layer 110 and forming a mask 112. FIG. 3 illustrates a top view of the structure 100 depicted in FIG. 4, and FIG. 4 illustrates a cross-section view of FIG. 3, taken along section line V-V.

In FIG. 4, a conductive material layer 110 is formed on the semiconductor device 100 to from a first conductive material interconnect 109', a second conductive material interconnect 109", a third conductive material interconnect 109''' and a fourth conductive material interconnect 109'. FIG. 4 is a further intermediary structure of the completed device shown in FIG. 7. The formation of the conductive material layer 110 occurs and the conductive material layer 110 extends through the openings 108 of the interlevel dielectric layer 106 and contacts the then exposed source/drain surfaces 105. The conductive material layer 110 also is formed on and extends over the interlevel dielectric layer 106.

The conductive material layer 110 can comprise any suitable material in accordance with the embodiments described herein. Examples of suitable materials that can be used to form the conductive material include, but are not limited to, Cu, Ru, Co, etc., and combinations thereof. The conductive material layer 110 can be deposited/formed in any suitable way.

As shown in FIG. 3, after formation of the conductive material layer 110, a conductive material mask 112 is formed on the conductive material layer 110. The conductive material mask 112 can be any suitable material that resists or substantially resists etching. Examples of suitable materials include one or more of each of photoresist, hard masking, etch-stop, anti-reflective coating, etc., in a single layer or multiple layers.

The conductive material mask 112 is formed on the conductive material layer 110, over the first conductive material interconnect 109', over the second conductive material interconnect 109", over the third conductive material interconnect 109', and on the conductive material mask 112 between the first conductive material interconnect 109' and the second conductive material interconnect 109". This formed, conductive material mask 112 is shown in FIG. 4. In FIG. 4, further conductive material mask 112 may also be formed over the fourth conductive material interconnect 109'.

Next, portions of the conductive material layer 110 are subtractively etched, exposing the underlying interlevel dielectric layer 106. Specifically, portions of the conductive material layer 110 between the third conductive material interconnect 109' and the second conductive material interconnect 109" are removed, exposing the interlevel dielectric layer 106 between the third conductive material interconnect 109''' and the second conductive material interconnect 109". Then, the conductive material mask 112 is removed using any suitable wet and/or dry technique. During this removal step, the interlevel dielectric layer 106 between the first conductive material interconnect 190' and the second conductive material interconnect 190" does not get exposed.

Figure 5:
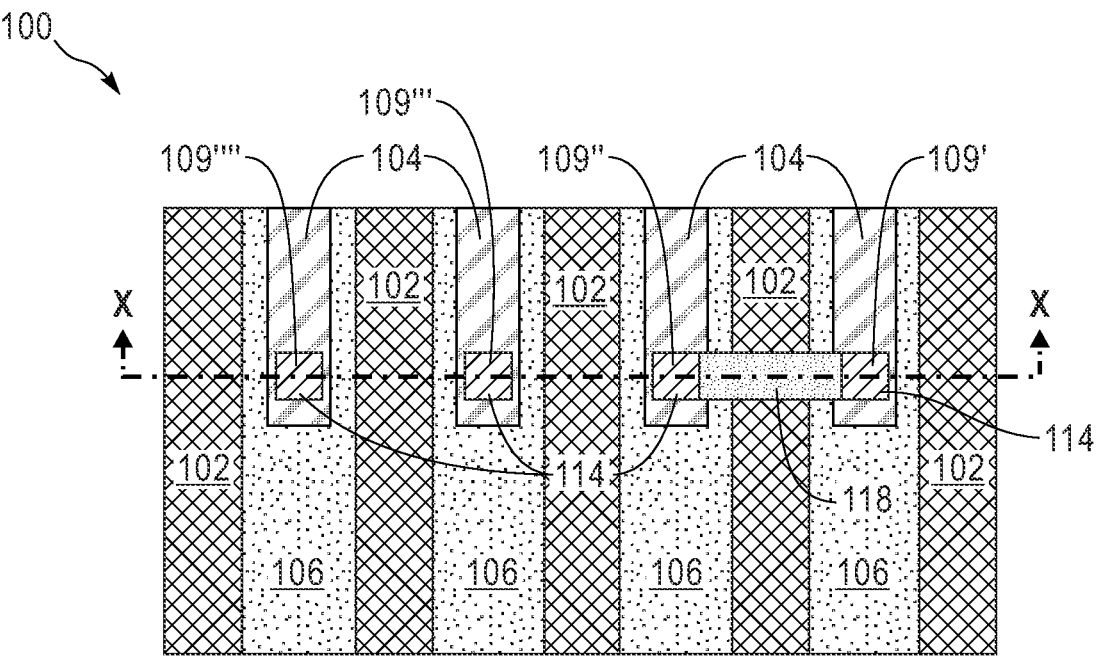
FIG. 5 depicts a top view of a semiconductor structure, of an embodiment of the disclosure.
Figure 6:
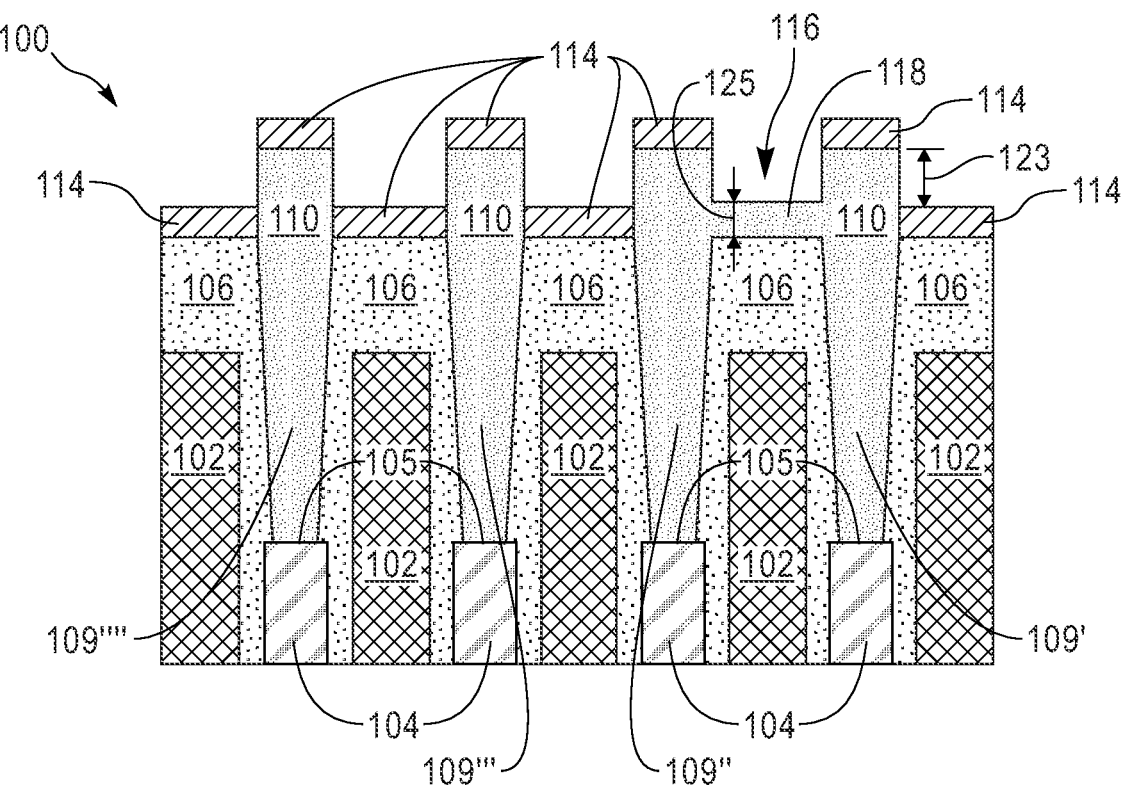
FIG. 6 depicts a cross-section view along section line X-X of the semiconductor structure of FIG. 5, of an embodiment of the disclosure.

Referring now to FIGS. 5 and 6, the structure 100 is depicted after forming a mask 114 and patterning a remaining portion of the metal layer 110. FIG. 5 illustrates a top view of the structure 100 depicted in FIG. 6, and FIG. 6 illustrates a cross-section view of FIG. 5, taken along section line X-X.

In FIG. 6 the interconnect mask 114 is shown. The interconnect mask 114 is formed, over portions of the conductive material layer 110. For example the interconnect mask 114 is formed above the third conductive material interconnect 109''', and on the exposed interlevel dielectric layer 106 between the third conductive material interconnect 109''' and the second conductive material interconnect 109". Additionally, the interconnect mask 114 is formed on the conductive material layer 110 over the second conductive material interconnect 109", and the conductive material layer 110 over the first conductive material interconnect 109'. An up-via 116 of the conductive material layer 110 is between the first conductive material interconnect 109' and the second conductive material interconnect 109".

Next, an interconnect 118 is formed by subtractive etching the portion of the conductive material layer 110 that is exposed in the up-via 116 through the interconnect mask 114. For example the conductive material layer 110 extended over the interlevel dielectric layer 106 is etched, and the conductive material layer 110 between the first conductive material interconnect 109' and the second conductive material interconnect 109" is etched.

As can be seen in FIG. 6, the interconnect 118 is thinner in a height dimension 125 as compared to a height dimension 123 of the conductive material layer 110, formed over the source/drain junction 105, which extends above the interlevel dielectric layer 106. This difference in height is due to the subtractive etching to create the interconnect 118.

Figure 7:
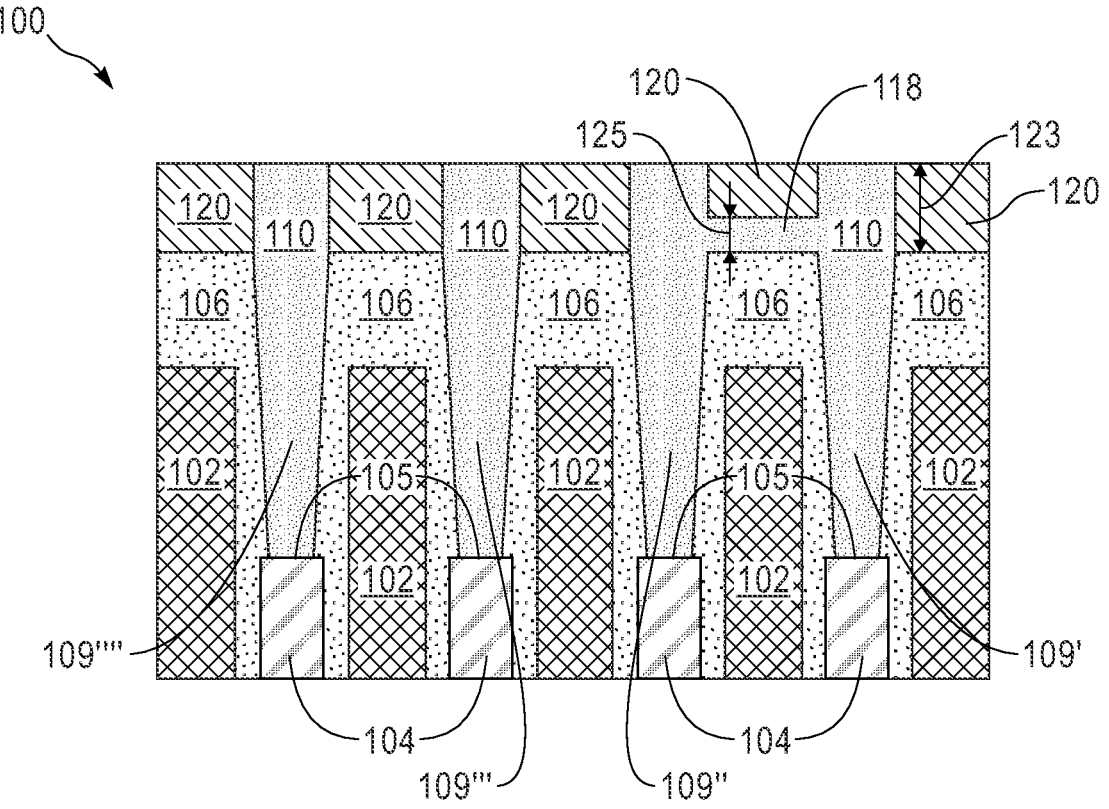
FIG. 7 depicts a cross-section view along the same location as section line X-X of the semiconductor structure of FIG. 5, of an embodiment of the disclosure.

After formation of the interconnect 118, an additional optional step can be performed, of forming an ultra-low-k dielectric layer 120 above the interconnect 118, as seen in FIG. 7. The ultra-low-k dielectric layer 120 may be formed of any suitable material with a dielectric constant less than that of $SiO_2$). The ultra-low-k dielectric layer 120 can be deposited/formed in any suitable way.

The ultra-low-k dielectric layer 120 can also be formed over other portions of the interlevel dielectric layer 106, such as portions between the second conductive material interconnect 109" and the third conductive material interconnect 109''', as seen in FIG. 7.

Thus, the device 100 is configured with the interconnect 118 that horizontally connects the first conductive material interconnect 109' and the second conductive material interconnect 109". The interconnect 118 has a portion being thinner in the height dimension 125 than the height dimension 123 of the conductive material layer 110. This thinner height dimension 125 is such that the interconnect 118 can be covered with, or buried by, the ultra-low-k dielectric layer 120. The structure and method of making device 100, having a local connection interconnect 118 covered with, or buried by, the ultra-low-k dielectric layer 120, is the result of an up-via metallization scheme, not a dual damascene method.

Figure 9:
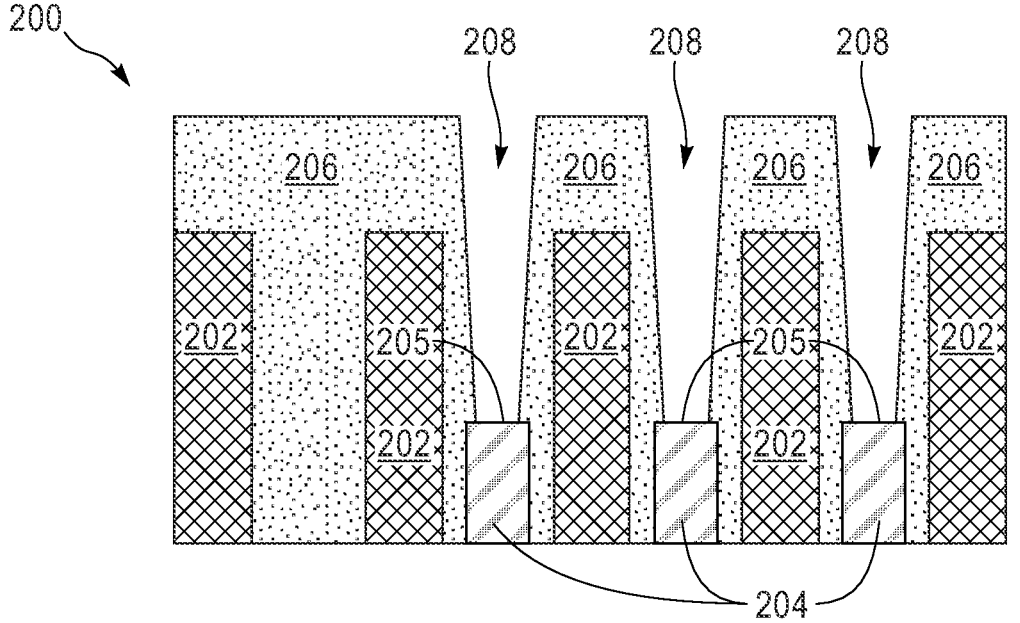
FIG. 9 depicts a cross-section view along section line Y-Y of the semiconductor structure of FIG. 8, of an embodiment of the disclosure.
Figure 13:
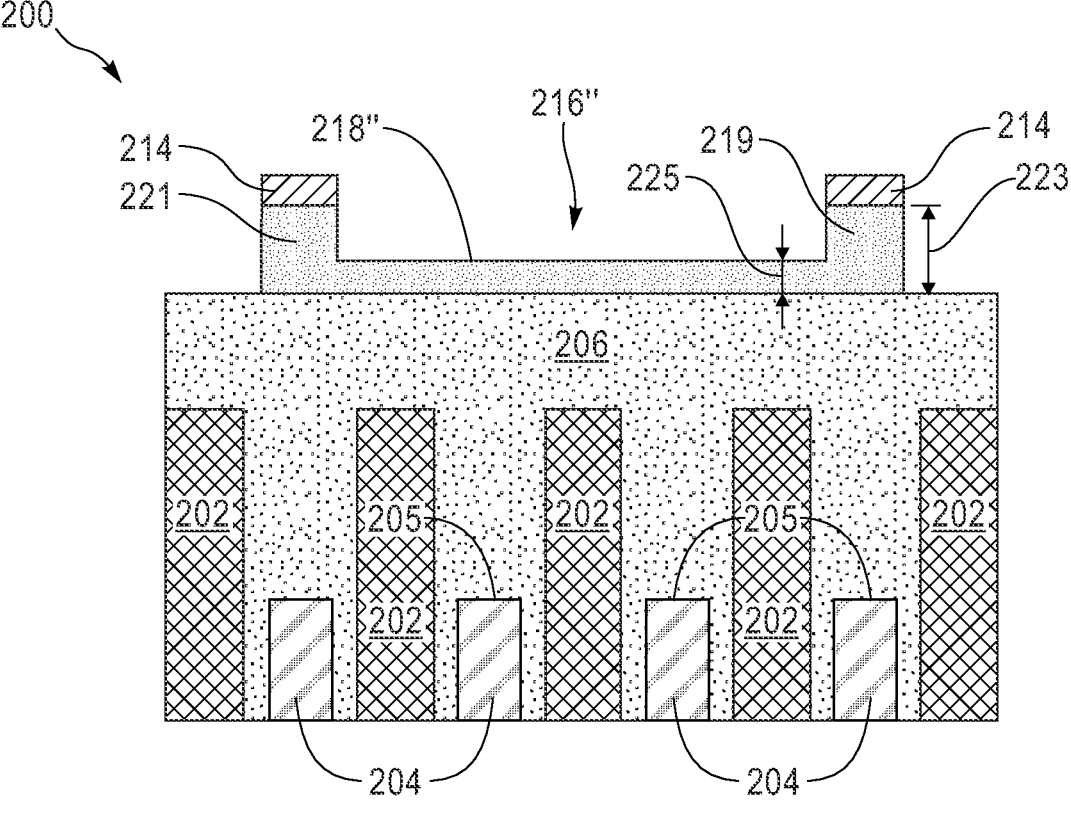
FIG. 13 depicts a cross-section view along section line T-T of the semiconductor structure of FIG. 12, of an embodiment of the disclosure.

Another embodiment of a semiconductor device 200 is shown in FIG. 9, with FIG. 9 being an intermediary structure of the completed device shown in FIG. 13. Elements shown in FIG. 9 are comparable to those of FIGS. 2-4, with the first digit in this embodiment being 2 rather than 1 in the semiconductor device 100 embodiment. For example, the gate structure 102 of FIGS. 2-4 are comparable, in formation and composition, to the gate structure 202 of the semiconductor device 200 embodiment. Thus, all reference numbers with the last two numbers being the same between semiconductor device 200 and the semiconductor device 100 are comparable, or the same, in formation and composition.

Referring to FIG. 9, which is a side view, a portion of semiconductor device 200 is shown. In this embodiment, the device 200 includes at least two gate structures 202 and at least two source/drain surfaces 205 of at least two source/drain regions 204. In some embodiments, the device 200 can include at least three gate structures 202 and at least three source/drain surfaces 205 of at least three source/drain regions. In some embodiments, the device 200 can include at least four gate structures 202 and at least four source/drain surfaces 205 of at least four source/drain regions. The source/drain regions 204 are exposed to the exterior of the device 200 through openings 208 of an interlevel dielectric layer 206. The interlevel dielectric layer 206 separates each of the gate structures 202 from each of the source/drain regions 204 and their respective source/drain surfaces 205. It is appreciated by those skilled in the art that the device 200 may include any number of gate structures 202, source/drain regions 204, source/drain surfaces 205 and interlevel dielectric layers 206, despite only four being shown in the figures.

Figure 8:
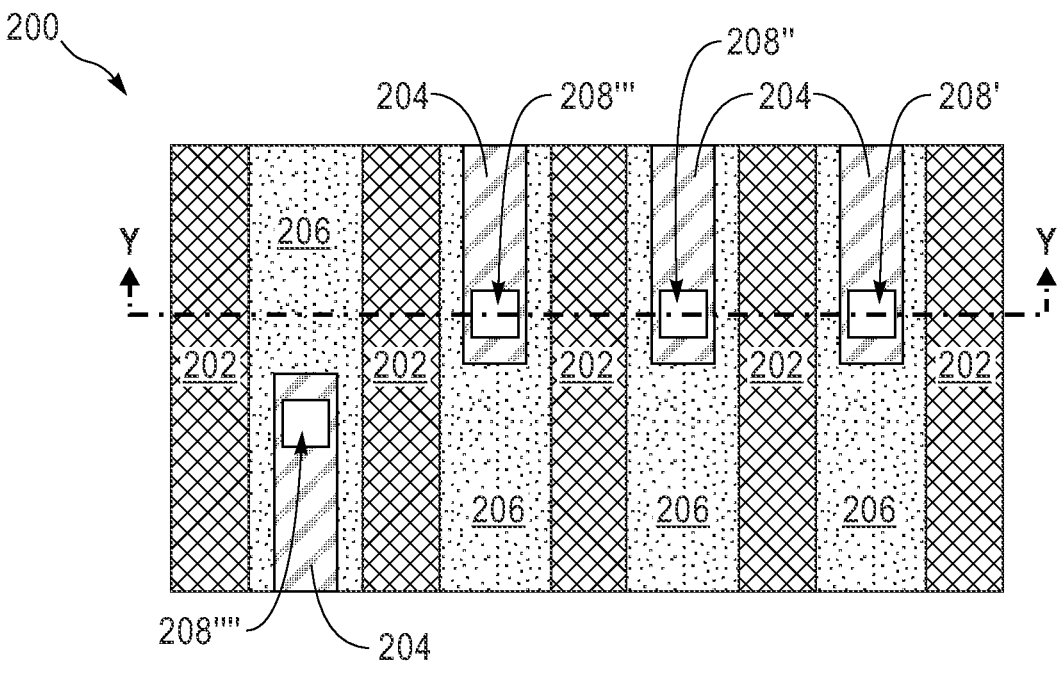
FIG. 8 depicts a top view of a semiconductor structure, of an embodiment of the disclosure.

A top view of the structure of FIG. 9 can be seen in FIG. 8. Line Y-Y of FIG. 8 illustrates the view of FIG. 9.

Figure 11:
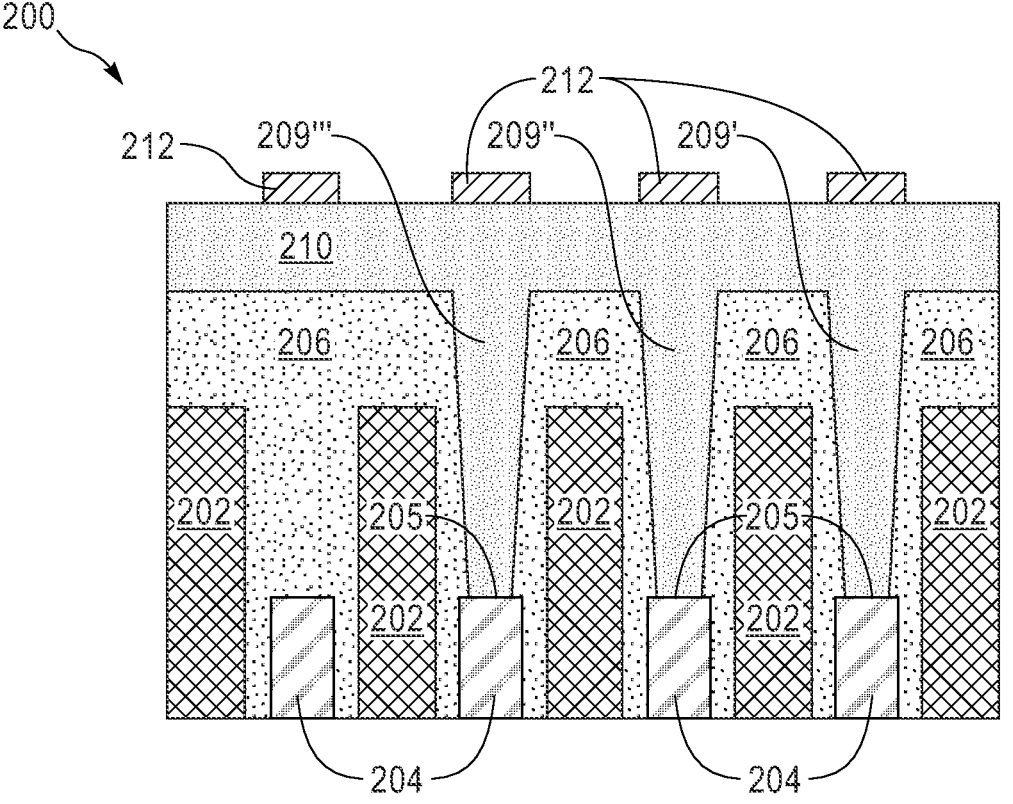
FIG. 11 depicts a cross-section view along section line S-S of the semiconductor structure of FIG. 10, of an embodiment of the disclosure.

In FIG. 11, a conductive material layer 210 is formed on the semiconductor device 200 to from a first conductive material interconnect 209', a second conductive material interconnect 209", a third conductive material interconnect 209''' and a fourth conductive material interconnect 209'. FIG. 11 is a further intermediary structure of the completed device shown in FIG. 13. The formation of the conductive material layer 210 occurs and the conductive material layer 210 extends through the openings 208 of the interlevel dielectric layer 206 and contacts the then exposed source/drain surfaces 205. The conductive material layer 210 also is formed on and extends over the interlevel dielectric layer 206.

After formation of the conductive material layer 210, a conductive material mask 212 can be formed on the conductive material layer 210. The conductive material mask 212 can be any suitable material that resists or substantially resists etching.

The conductive material mask 212 is formed on the conductive material layer 210, over the first conductive material interconnect 209', over the second conductive material interconnect 209", over the third conductive material interconnect 209''', over the fourth conductive material interconnect 209' and over other portions of the conductive material layer 210 that are over portions of the interlevel dielectric layer 206. These other portions of the interlevel dielectric layer 206 can be in a direction substantially perpendicular to the gate structures 202.

Figure 10:
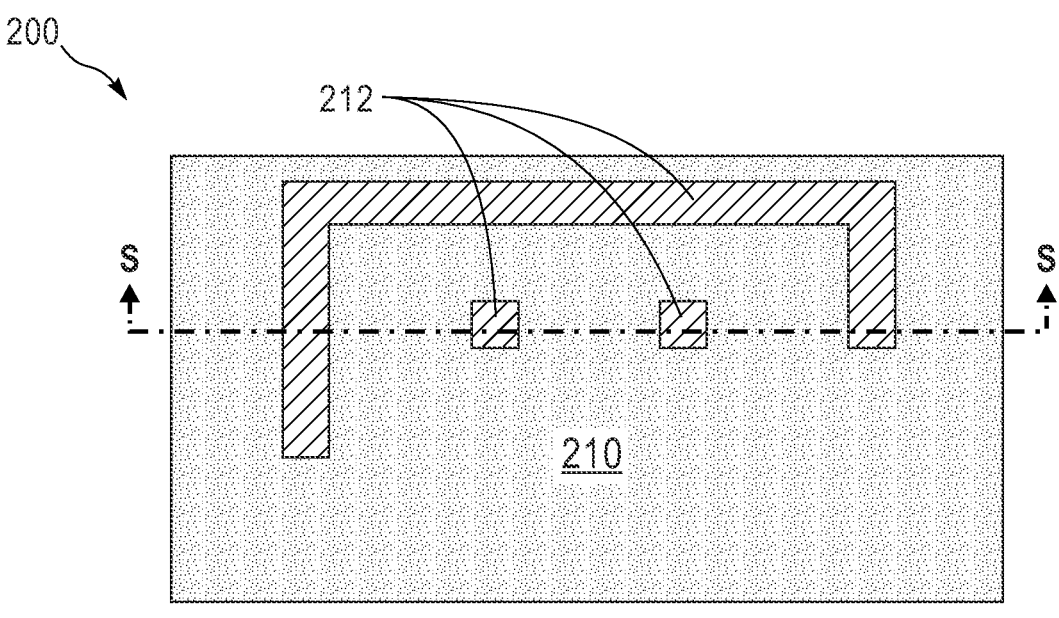
FIG. 10 depicts a top view of a semiconductor structure, of an embodiment of the disclosure.

This formed, conductive material mask 212 is shown in FIG. 11. Additionally, a top view of the structure of FIG. 11 can be seen in FIG. 10. As can be seen in FIG. 10, the conductive material mask 212 extends in directions both substantially perpendicular to the gate structures 202 and directions substantially parallel with the gate structures 202.

Next, portions of the conductive material layer 210 are subtractively etched, exposing the underlying interlevel dielectric layer 206. Specifically, all portions of the conductive material layer 210 not having the conductive material mask 212 formed thereon are etched. Then, the conductive material mask 212 is removed using any suitable wet and/or dry technique.

Figure 12:
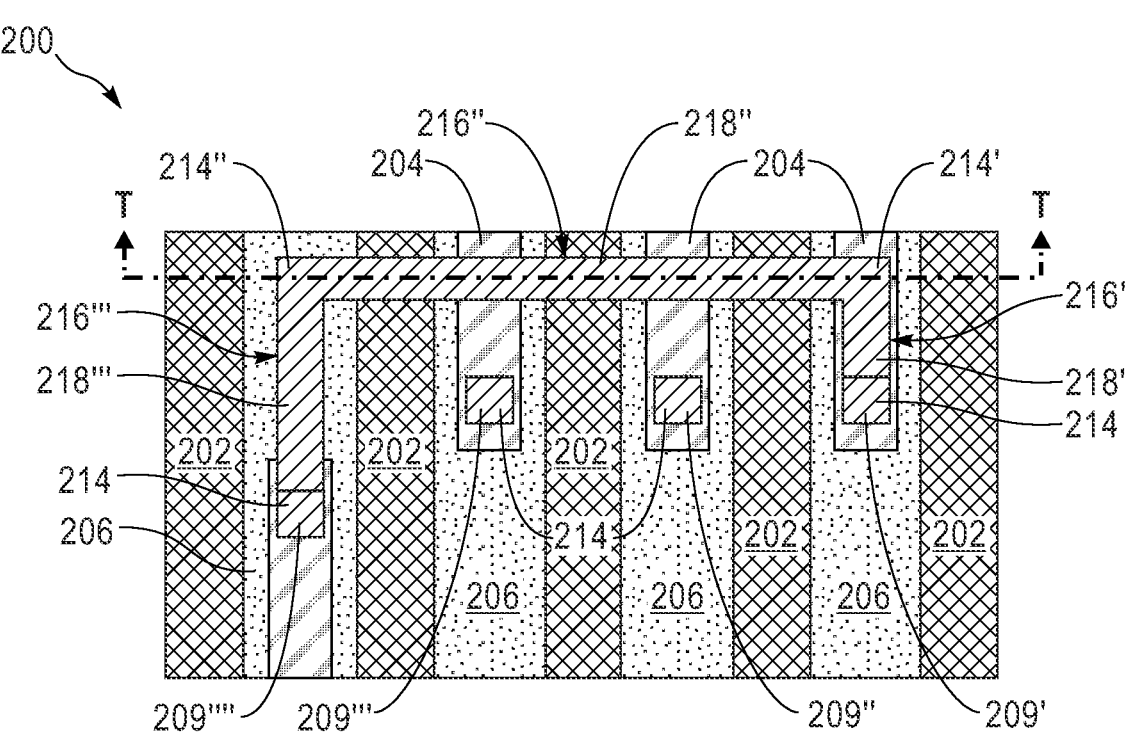
FIG. 12 depicts a top view of a semiconductor structure, of an embodiment of the disclosure.

In FIG. 13 the interconnect mask 214 is shown. The interconnect mask 214 is formed, over portions of the conductive material layer 210, for example above the fourth conductive material interconnect 209", the third conductive material interconnect 209''', the second conductive material interconnect 209", the first conductive material interconnect 209'. Additionally, the interconnect mask 214 can be formed over a portion of the conductive material layer 210, as interconnect mask 214', which forms an up-via 216' of the conductive material layer 210 between the interconnect mask 214' and the interconnect mask 214 over the first conductive material interconnect 209', as shown in FIG. 12. A top view of the structure of FIG. 13 is seen in FIG. 12. Line Y'-Y' of FIG. 12 illustrates the view of FIG. 13. In FIG. 12 the interlevel dielectric layer 206 is shown as being transparent, for illustrative purposes.

Additionally, the interconnect mask 214 can be formed over a portion of the conductive material layer 210, as interconnect mask 214", which forms an up-via 216" of the conductive material layer 210 between the interconnect mask 214' and the interconnect mask 214", and forms an up-via 216''' between the interconnect mask 214" and the interconnect mask 214 over the fourth conductive material interconnect 209"".

Next, interconnects are formed, specifically interconnect 218', interconnect 218" and interconnect 218"', by subtractive etching the portion of the conductive material layer 210 that are exposed, up-vias 216', 216" and 216'''. The formed interconnect 218" is shown in both FIGS. 13 and 12. The formed interconnects 218' and 218''' are shown in FIG. 12.

As can be seen in FIG. 13, the interconnect 218" is thinner in a height dimension 225 as compared to a height dimension 223 of the conductive material layer 210, formed over the source/drain junction 205, which extends above the interlevel dielectric layer 206. This difference in height is due to the subtractive etching to create the interconnect 218".

After formation of interconnects 218', 218", and 218"', an additional optional step can be performed, of forming an ultra-low-k dielectric layer above the interconnects 218', 218", and 218"' (not shown). The ultra-low-k dielectric layer may be formed of any suitable material with a dielectric constant less than that of $SiO_2$). The ultra-low-k dielectric layer can be deposited/formed in any suitable way. During this optional step, or subsequent to this optional step, the ultra-low-k dielectric layer can be formed over other portions of the interlevel dielectric layer 206 as well.

Figure 14:
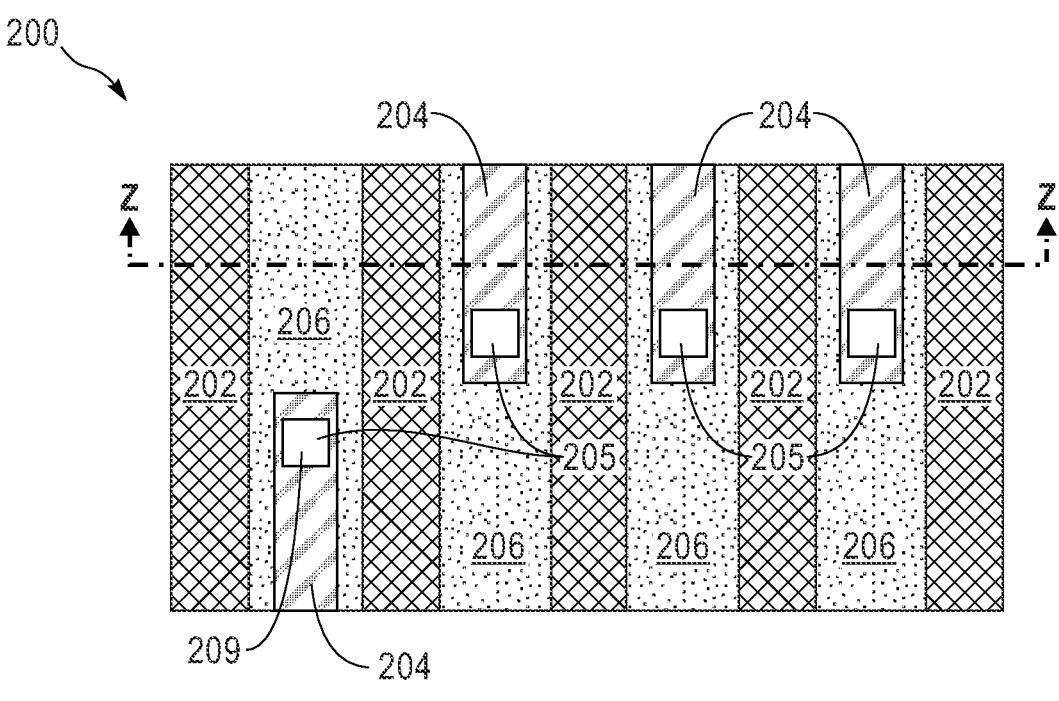
FIG. 14 depicts a top view of a semiconductor structure, of an embodiment of the disclosure.
Figure 15:
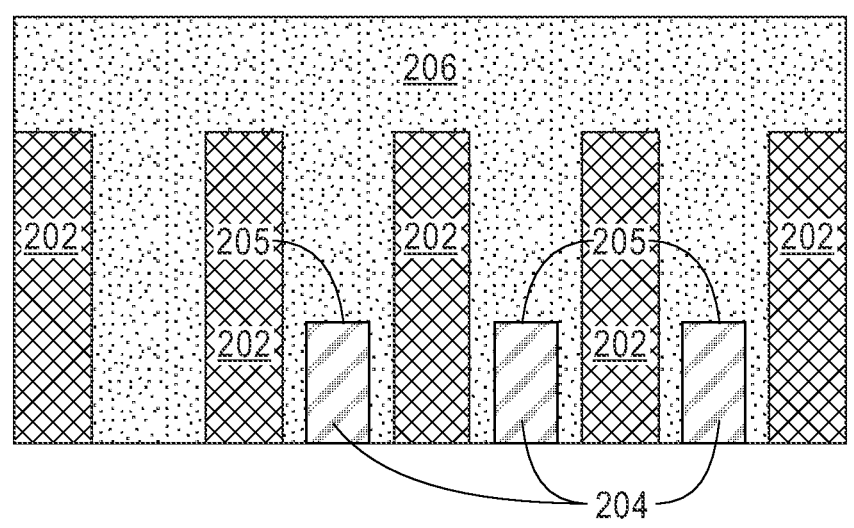
FIG. 15 depicts a cross-section view along section line Z-Z of the semiconductor structure of FIG. 14, of an embodiment of the disclosure.
Figure 16:
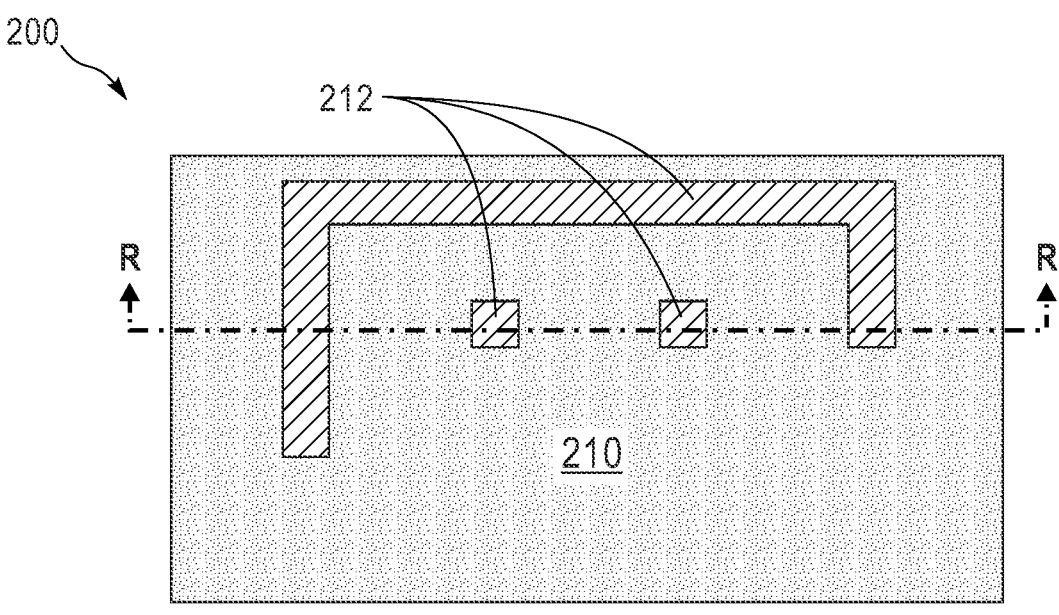
FIG. 16 depicts a top view a semiconductor structure, of an embodiment of the disclosure.
Figure 17:
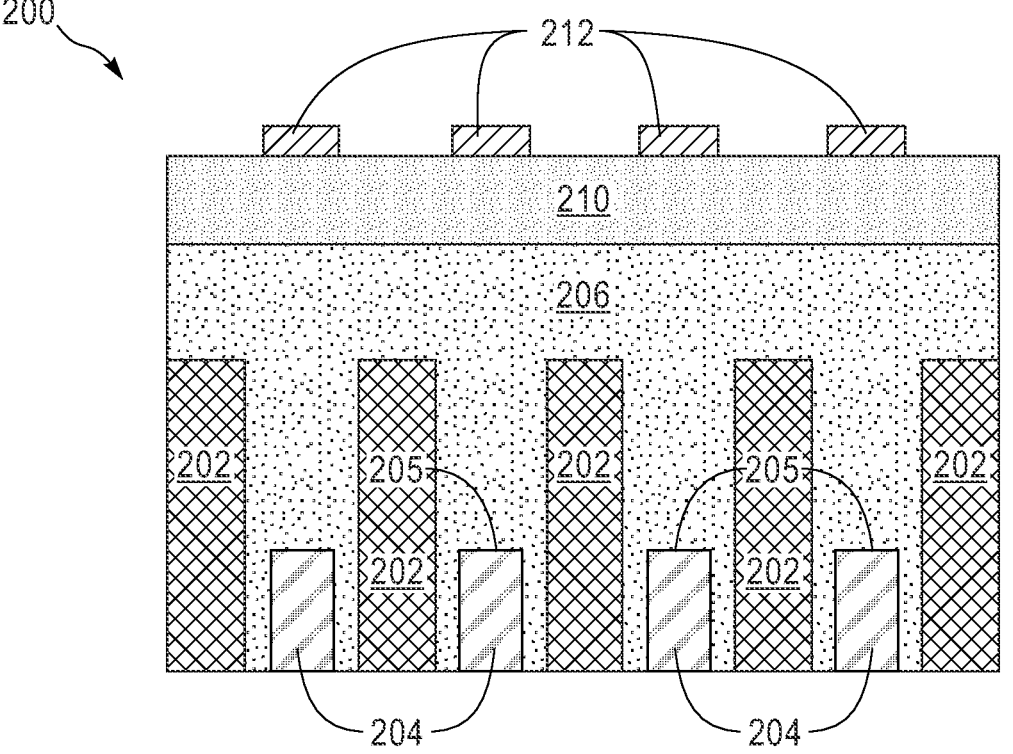
FIG. 17 depicts a cross-section view along section line R-R of the semiconductor structure of FIG. 16, of an embodiment of the disclosure.
Figure 18:
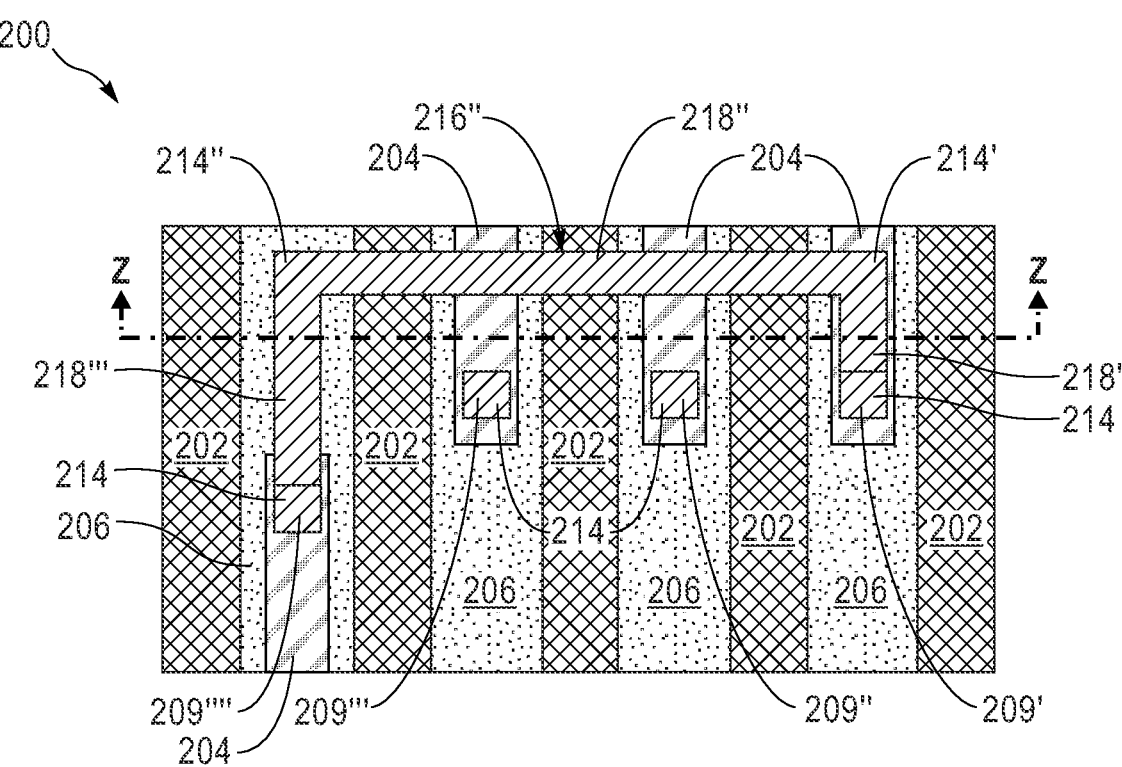
FIG. 18 depicts a top view a semiconductor structure, of an embodiment of the disclosure.
Figure 19:
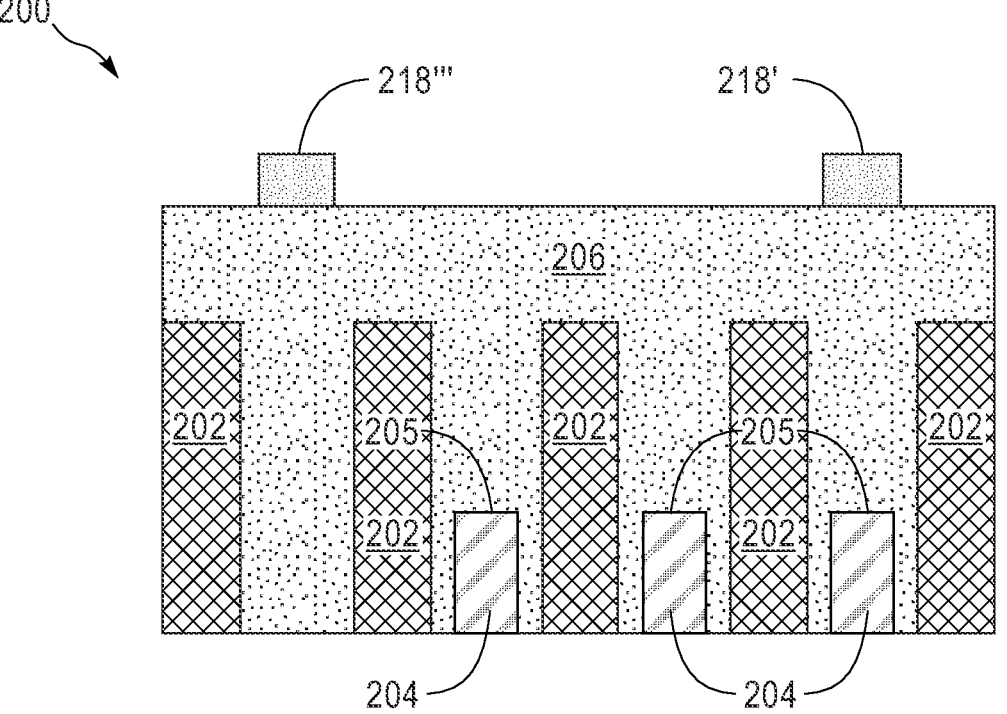
FIG. 19 depicts a cross-section view along section line Q-Q of the semiconductor structure of FIG. 18, of an embodiment of the disclosure.

As further explanation, FIGS. 15-18 are presented of device 200, which are the same structurally as the device 200 of FIGS. 9-12, and correspond to each of FIGS. 9-12. However, the side views of FIGS. 15, 17 and 19 are taken in a different cross section, illustrated as line Z-Z of FIGS. 14 and 18.

Thus, the device 200 is configured with the interconnect 218 that horizontally connects the first conductive material interconnect 209' and the second conductive material interconnect 209". The interconnect 218" has a portion being thinner in the height dimension 225 than the height dimension 223 of the conductive material layer 210. This thinner height dimension 225 is such that the interconnect 218" can be covered with, or buried by, the ultra-low-k dielectric layer 220. The structure and method of making device 200, having a local connection of the interconnect 218" covered with, or buried by, the ultra-low-k dielectric layer 220, is the result of an up-via metallization scheme, not a dual damascene method.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A method for fabricating a semiconductor device, the method comprising:

forming a conductive material layer on a semiconductor device, the semiconductor device comprising at least two gate structures and at least two source/drain surfaces of at least two source/drain regions, wherein an interlevel dielectric layer separates each of the at least two gate structures from each of the at least two source/drain surfaces, wherein the conductive material layer extends through openings of the interlevel dielectric layer, contacts the at least two source/drain surfaces and forms at least two conductive material interconnects, and wherein the conductive material layer extends over the interlevel dielectric layer;

forming an interconnect mask over portions of the conductive material layer, wherein the conductive material layer comprises an up-via, wherein the conductive material layer is formed over a portion of the interlevel dielectric layer between neighboring conductive material interconnects and the interconnect mask is formed over portions of the conductive material layer adjacent to the neighboring conductive material interconnects, and the conductive material layer between the neighboring conductive material interconnects is exposed; and forming an interconnect by subtractively etching a portion of the conductive material layer, exposed through the interconnect mask.

2. The method of claim 1, further comprising forming an ultra-low-k dielectric layer above the interconnect.

3. The method of claim 2, wherein the ultra-low-k dielectric layer is coplanar with a portion of each of the at least two conductive material interconnects.

4. A method for fabricating a semiconductor device, the method comprising:

forming a conductive material layer on a semiconductor device, the semiconductor device comprising at least two gate structures and at least two source/drain surfaces of at least two source/drain regions, wherein an interlevel dielectric layer separates each of the at least two gate structures from each of the at least two source/drain surfaces, wherein the conductive material layer extends through openings of the interlevel dielectric layer, contacts the at least two source/drain surfaces and forms at least two conductive material interconnects, and wherein the conductive material layer extends over the interlevel dielectric layer in a direction substantially perpendicular to the at least two gate structures;

forming an interconnect mask over portions of the conductive material layer, wherein the conductive material layer comprises an up-via, and the conductive material layer between the portions of the conductive material layer are exposed; and forming an interconnect by subtractively etching a portion of the conductive material layer, exposed through the interconnect mask.

5. A method for fabricating a semiconductor device, the method comprising:

forming a conductive material layer on a semiconductor device, the semiconductor device comprising at least three gate structures and at least three source/drain surfaces of at least three source/drain regions, wherein an interlevel dielectric layer separates each of the at least three gate structures from each of the at least three source/drain surfaces, wherein the conductive material layer extends through openings of the interlevel dielectric layer, contacts the at least three source/drain surfaces and forms at least three conductive material interconnects, and wherein the conductive material layer extends over the interlevel dielectric layer, between at least three conductive material interconnects;

forming a conductive material mask on the conductive material layer over a first source/drain surface of the at least three conductive material interconnects, on the conductive material layer over a second conductive material interconnect of the at least three conductive material interconnects, on the conductive material layer over a third conductive material interconnect of the at least three conductive material interconnects, and on the conductive material layer above the interlevel dielectric layer, between the first conductive material interconnect and the second conductive material interconnect;

forming an interconnect mask over portions of the conductive material layer, wherein the conductive material layer comprises an up-via; and forming an interconnect by subtractively etching a portion of the conductive material layer, exposed through the interconnect mask.

6. The method of claim 5, further comprising: subtractively etching the conductive material layer between the third conductive material interconnect and the second conductive material interconnect, exposing the interlevel dielectric layer between the third conductive material interconnect and the second conductive material interconnect.

7. The method of claim 6, further comprising:

forming the interconnect mask over the conductive material layer above the third conductive material interconnect, the exposed interlevel dielectric layer between the third conductive material interconnect and the second conductive material interconnect, the conductive material layer over the second conductive material interconnect, and the conductive material layer over the first conductive material interconnect, wherein the conductive material layer between the first conductive material interconnect and the second conductive material interconnect comprises the up-via.

8. The method of claim 7, further comprising:

forming the interconnect by subtractively etching the portion of the conductive material layer extended over the interlevel dielectric layer, between the first conductive material interconnect and the second conductive material interconnect.

9. The method of claim 8, further comprising the step of forming an ultra-low-k dielectric layer above the interconnect.

10. The method of claim 8, further comprising the step of forming an ultra-low-k dielectric layer on the interlevel dielectric layer between the second source/drain surface and the third source/drain surface.

11. The method of claim 10, wherein the ultra-low-k dielectric layer above the interconnect is coplanar with the ultra-low-k dielectric layer on the interlevel dielectric layer between the second source/drain surface and the third source/drain surface.

\* \* \* \* \*